US008970127B2

(12) United States Patent
Matsuda et al.

(10) Patent No.: US 8,970,127 B2
(45) Date of Patent: Mar. 3, 2015

(54) LIGHTING CIRCUIT AND ILLUMINATION DEVICE

(71) Applicants: Toshiba Lighting & Technology Corporation, Yokosuka-shi (JP); Kabushiki Kaisha Toshiba, Tokyo (JP)

(72) Inventors: Mitsuhiro Matsuda, Yokosuka (JP); Naoko Iwai, Yokosuka (JP); Hajime Osaki, Yokosuka (JP); Hiroshi Kubota, Yokosuka (JP); Takuro Hiramatsu, Yokosuka (JP); Katsusuke Uchino, Yokosuka (JP); Masatoshi Kumagai, Yokosuka (JP)

(73) Assignees: Toshiba Lighting & Technology Corporation, Kanagawa (JP); Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 13/776,409

(22) Filed: Feb. 25, 2013

(65) Prior Publication Data

US 2013/0162155 A1 Jun. 27, 2013

Related U.S. Application Data

(62) Division of application No. 12/860,528, filed on Aug. 20, 2010, now Pat. No. 8,427,070.

(30) Foreign Application Priority Data

Aug. 21, 2009 (JP) ................................ 2009-192280
Jun. 15, 2010 (JP) ................................ 2010-135705

(51) Int. Cl.
*H05B 37/02* (2006.01)
*H01L 33/00* (2010.01)
*H05B 33/08* (2006.01)

(52) U.S. Cl.
CPC ........ *H05B 33/0839* (2013.01); *H05B 33/0815* (2013.01)
USPC ............ 315/291; 315/224; 315/312; 315/308

(58) Field of Classification Search
USPC ......... 315/291, 224, 226, 244, 312, 307, 308, 315/209 R
See application file for complete search history.

(56) References Cited

U.S. PATENT DOCUMENTS 3,697,774 A 10/1972 Pascente
3,881,137 A 4/1975 Thanawala (Continued)

FOREIGN PATENT DOCUMENTS

CN 1211895 3/1999
CN 1843061 10/2006

(Continued)

OTHER PUBLICATIONS

U.S. Appl. No. 12/777,303 electronically captured on Dec. 23, 2013.

(Continued)

*Primary Examiner* — Daniel D Chang
(74) *Attorney, Agent, or Firm* — DLA Piper LLP (US)

(57) ABSTRACT

A lighting circuit according to embodiments includes: a self-hold element connected in series to an AC power source that generates power for lighting an illumination load, together with the illumination load, the self-hold element being configured to control supply of the power provided by the AC power source to the illumination load by the self-hold element being turned on/off; a noise prevention circuit connected in parallel to the self-hold element; and a damping circuit configured to connect a damping resistance to the noise prevention circuit parallely only for a predetermined period from turning-on of the self-hold element, thereby preventing the self-hold element from being repeatedly turned on/off during a period in which the self-hold element is on under normal conditions, due to a transient during power supply.

15 Claims, 11 Drawing Sheets

(56) References Cited

U.S. PATENT DOCUMENTS

| | | | | |
|---|---|---|---|---|
| 4,864,482 | A | 9/1989 | Quazi | |
| 5,811,941 | A | 9/1998 | Barton | |
| 5,834,924 | A | 11/1998 | Konopka | |
| 6,153,980 | A | 11/2000 | Marshall | |
| 6,628,093 | B2 | 9/2003 | Stevens | |
| 6,747,420 | B2 | 6/2004 | Barth | |
| 6,787,999 | B2 | 9/2004 | Stimac | |
| 6,969,977 | B1 | 11/2005 | Smith | |
| 6,998,792 | B2 | 2/2006 | Takahashi | |
| 7,081,709 | B2 | 7/2006 | Pak | |
| 7,102,340 | B1 | 9/2006 | Ferguson | |
| 7,106,036 | B1 | 9/2006 | Collins | |
| 7,164,235 | B2 | 1/2007 | Ito | |
| 7,202,608 | B2 | 4/2007 | Robinson | |
| 7,262,559 | B2 | 8/2007 | Tripathi | |
| 7,557,520 | B2 | 7/2009 | Chen | |
| 7,564,434 | B2 | 7/2009 | Kim | |
| 7,595,229 | B2 | 9/2009 | Ihme | |
| 7,656,103 | B2 * | 2/2010 | Shteynberg et al. | 315/312 |
| 7,791,326 | B2 | 9/2010 | Dahlman | |
| 7,804,256 | B2 | 9/2010 | Melanson | |
| 7,855,520 | B2 | 12/2010 | Leng | |
| 7,906,617 | B2 | 3/2011 | Cunningham | |
| 7,976,182 | B2 | 7/2011 | Ribarich | |
| 7,999,484 | B2 | 8/2011 | Jurngwirth | |
| 8,013,544 | B2 | 9/2011 | Negrete | |
| 8,018,171 | B1 | 9/2011 | Melanson | |
| 8,018,173 | B2 | 9/2011 | Shackle | |
| 8,044,608 | B2 | 10/2011 | Kuo | |
| 8,076,867 | B2 | 12/2011 | Kuo | |
| 8,076,920 | B1 | 12/2011 | Melanson | |
| 8,093,826 | B1 | 1/2012 | Eagar | |
| 8,098,021 | B2 | 1/2012 | Wang | |
| 8,102,127 | B2 | 1/2012 | Melanson | |
| 8,134,304 | B2 | 3/2012 | Hsu | |
| 8,212,491 | B2 | 7/2012 | Kost | |
| 8,212,494 | B2 | 7/2012 | Veltman | |
| 2005/0253533 | A1 | 11/2005 | Lys | |
| 2006/0001381 | A1 | 1/2006 | Robinson | |
| 2006/0022916 | A1 | 2/2006 | Aiello | |
| 2006/0071614 | A1 | 4/2006 | Tripathi | |
| 2006/0119181 | A1 | 6/2006 | Namba | |
| 2006/0170370 | A1 | 8/2006 | De Anna | |
| 2006/0192502 | A1 | 8/2006 | Brown | |
| 2006/0238174 | A1 | 10/2006 | Russell | |
| 2006/0261754 | A1 | 11/2006 | Lee | |
| 2007/0030709 | A1 | 2/2007 | Kitagawa | |
| 2007/0069663 | A1 | 3/2007 | Burdalski | |
| 2007/0182347 | A1 | 8/2007 | Shteynberg et al. | |
| 2007/0183173 | A1 | 8/2007 | Wu | |
| 2007/0188112 | A1 | 8/2007 | Kang et al. | |
| 2007/0216320 | A1 | 9/2007 | Grivas | |
| 2008/0012502 | A1 | 1/2008 | Lys | |
| 2008/0054817 | A1 | 3/2008 | Kao | |
| 2008/0074058 | A1 | 3/2008 | Lee et al. | |
| 2008/0180036 | A1 | 7/2008 | Garrity | |
| 2008/0203934 | A1 | 8/2008 | Van Meurs | |
| 2008/0238387 | A1 | 10/2008 | Schmeller | |
| 2008/0258647 | A1 | 10/2008 | Scianna | |
| 2008/0258698 | A1 | 10/2008 | Kitagawa | |
| 2008/0259655 | A1 | 10/2008 | Wei | |
| 2008/0278092 | A1 | 11/2008 | Lys | |
| 2008/0316781 | A1 | 12/2008 | Liu | |
| 2009/0021470 | A1 | 1/2009 | Lee | |
| 2009/0079363 | A1 | 3/2009 | Ghoman | |
| 2009/0116232 | A1 | 5/2009 | Chang | |
| 2009/0121641 | A1 | 5/2009 | Shih | |
| 2009/0122580 | A1 | 5/2009 | Stamm | |
| 2009/0184662 | A1 | 7/2009 | Given | |
| 2009/0184666 | A1 | 7/2009 | Myers | |
| 2009/0195168 | A1 | 8/2009 | Greenfeld | |
| 2009/0295300 | A1 | 12/2009 | King | |
| 2010/0013405 | A1 | 1/2010 | Thompson | |
| 2010/0013409 | A1 | 1/2010 | Quek | |
| 2010/0090618 | A1 * | 4/2010 | Veltman | 315/307 |
| 2010/0207536 | A1 | 8/2010 | Burdalski | |
| 2010/0213845 | A1 | 8/2010 | Aiello | |
| 2010/0289426 | A1 | 11/2010 | Takasaka | |
| 2010/0308742 | A1 | 12/2010 | Melanson | |
| 2011/0012523 | A1 | 1/2011 | Pasma | |
| 2011/0273095 | A1 | 11/2011 | Myers | |
| 2011/0291587 | A1 | 12/2011 | Melanson | |
| 2012/0139431 | A1 | 6/2012 | Thompson | |

FOREIGN PATENT DOCUMENTS

| | | |
|---|---|---|
| CN | 2854998 | 1/2007 |
| CN | 201282521 | 7/2009 |
| CN | 101513122 | 8/2009 |
| CN | 101827477 | 9/2010 |
| EP | 1608206 | 12/2005 |
| EP | 1689212 | 8/2006 |
| EP | 2257130 | 12/2010 |
| JP | 02-284381 | 11/1990 |
| JP | 09-045481 | 2/1997 |
| JP | 10-0064683 | 6/1998 |
| JP | 11-087072 | 3/1999 |
| JP | 2001-210478 | 8/2001 |
| JP | 2002-231471 | 8/2002 |
| JP | 2003-157986 | 5/2003 |
| JP | 2004-119078 | 4/2004 |
| JP | 2004-265756 | 9/2004 |
| JP | 2004-327152 | 11/2004 |
| JP | 2005-011739 | 1/2005 |
| JP | 2005-129512 | 5/2005 |
| JP | 2006-054362 | 2/2006 |
| JP | 2006-108117 | 4/2006 |
| JP | 2006-210835 | 8/2006 |
| JP | 2006-269349 | 10/2006 |
| JP | 2007-6658 | 1/2007 |
| JP | 2007-042758 | 2/2007 |
| JP | 2007-189004 | 7/2007 |
| JP | 2007-234415 | 9/2007 |
| JP | 2007-281424 | 10/2007 |
| JP | 2007-306644 | 11/2007 |
| JP | 2007-538378 | 12/2007 |
| JP | 2008-504654 | 2/2008 |
| JP | 2008-053695 | 3/2008 |
| JP | 2008-210537 | 9/2008 |
| JP | 2008-310963 | 12/2008 |
| JP | 2009-123681 | 6/2009 |
| JP | 2009-218528 | 9/2009 |
| JP | 2009-232625 | 10/2009 |
| JP | 2010-212267 | 9/2010 |
| WO | WO 99/56504 | 11/1999 |
| WO | WO 03/096761 | 11/2003 |
| WO | WO 2005/115058 | 12/2005 |
| WO | WO 2006/120629 | 11/2006 |
| WO | WO 2008/029108 | 3/2008 |
| WO | WO 2009/014418 | 1/2009 |
| WO | WO 2009/55821 | 4/2009 |
| WO | WO 2009/119617 | 10/2009 |

OTHER PUBLICATIONS

U.S. Appl. No. 12/873,348 electronically captured on Dec. 23, 2013.
U.S. Appl. No. 12/874,282 electronically captured on Dec. 23, 2013.
U.S. Appl. No. 12/764,995 electronically captured on Dec. 23, 2013.
U.S. Appl. No. 13/687,973 electronically captured on Dec. 23, 2013.
English language abstract of JP 2005-11739 published Jan. 13, 2005.
Machine English language translation of JP 2005-11739 published Jan. 13, 2005.
English language abstract of JP 11-087072 published Mar. 30, 1999.
Machine English language translation of JP 11-087072 published Mar. 30, 1999.
U.S. Appl. No. 12/777,303 electronically captured on Aug. 20, 2013.
U.S. Appl. No. 12/873,348 electronically captured on Aug. 20, 2013.
U.S. Appl. No. 12/874,282 electronically captured on Aug. 20, 2013.
U.S. Appl. No. 12/885,053 electronically captured on Aug. 20, 2013.
U.S. Appl. No. 12/860,528 electronically captured on Aug. 20, 2013.
U.S. Appl. No. 12/557,179 electronically captured on Aug. 20, 2013.
U.S. Appl. No. 12/764,995 electronically captured on Aug. 20, 2013.

(56) References Cited

OTHER PUBLICATIONS

U.S. Appl. No. 12/873,744 electronically captured on Aug. 20, 2013.
U.S. Appl. No. 12/873,759 electronically captured on Aug. 20, 2013.
Extended European Search Report issued in EP 10173250.1-1239 on Oct. 19, 2012.
Chinese Office Action issued in CN 201010259213.8 mailed Jan. 24, 2013.
English Language Translation of Chinese Office Action issued in CN 201010259213.8 mailed Jan. 24, 2013.
English Language Abstract CN20128521 published on Jul. 29, 2009.
English Language Abstract of CN 1211895 published Mar. 24, 1999.
U.S. Appl. No. 12/777,303 electronically captured on Jun. 5, 2014.
U.S. Appl. No. 12/873,348 electronically captured on Jun. 5, 2014.
U.S. Appl. No. 12/764,995 electronically captured on Jun. 5, 2014.
U.S. Appl. No. 13/687,973 electronically captured on Jun. 5, 2014.
English language abstract of JP 2008-210537, published Sep. 11, 2008.
Machine English language translation of JP 2008-210537, published Sep. 11, 2008.
English language abstract of JP-2008-053695 published Mar. 6, 2008.
Machine English language translation of JP-2008-053695 published Mar. 6, 2008.
English language abstract of JP-2007-538378 published Dec. 27, 2007.
Machine English language translation of JP-2007-538378 published Dec. 27, 2007.
English Language Abstract of JP 2009-218528 Published Sep. 24, 2009.
English Language Translation of JP 2009-218528 Published Sep. 24, 2009.
English Language Abstract of JP 2004-119078 Published Apr. 15, 2004.
English Language Translation of JP 2004-119078 Published Apr. 15, 2004.
English Language Abstract of JP 2007-6658 Published Jan. 11, 2007.
English Language Translation of JP 2007-6658 Published Jan. 11, 2007.
English Language Abstract of JP 2003-157986 Published May 30, 2003.
English Language Translation of JP 2003-157986 Published May 30, 2003.
English Language Abstract of JP 2008-310963 Published Dec. 25, 2008.
English Language Translation of JP 2008-310963 Published Dec. 25, 2008.
International Search Report issued in PCT/JP2009/055871 on Jun. 9, 2009.
English Language Abstract of JP 2002-231471 Published Aug. 15, 2002.
English Language Translation of JP 2002-231471 Published Aug. 15, 2002.
English Language Abstract of JP 2004-327152 Published Nov. 18, 2004.
English Language Translation of JP 2004-327152 Published Nov. 18, 2004.
English Language Abstract of JP 2005-129512 Published May 19, 2005.
English Language Translation of JP 2005-129512 Published May 19, 2005.
English Language Abstract of JP 2007-234415 Published Sep. 13, 2007.
English Language Translation of JP 2007-234415 Published Sep. 13, 2007.
English Language Abstract of JP 2001-210478 Published Aug. 3, 2001.
English Language Translation of JP 2001-210478 Published Aug. 3, 2001.
English Language Abstract of JP 2006-269349 Published Oct. 5, 2006.
English Language Translation of JP 2006-269349 Published Oct. 5, 2006.
International Search Report issued in PCT/JP2009/055873 on Jun. 9, 2009.
Japanese Office Action issued in JP 2008-076837 on Jul. 6, 2010.
English Translation of Japanese Office Action issued in JP 2008-076837 on Jul. 6, 2010.
English Language Abstract of JP 2006-108117 published Apr. 20, 2006.
Machine Translation of JP 2006-108117 published Apr. 20, 2006.
English Language Abstract of JP 2008-281424 published Nov. 20, 2008.
Machine Translation of JP 2008-281424 published Nov. 20, 2008.
Japanese Office Action issued in JP 2008-076835 on Aug. 24, 2010.
English Translation of Japanese Office Action issued in JP 2008-076835 on Aug. 24, 2010.
Extended European Search Report issued in European Appl. 09011497.6 on Jan. 28, 2010.
English Language Abstract of JP 2004-265756 published on Sep. 24, 2004.
English Language Translation of JP 2004-265756 published on Sep. 24, 2004.
Japanese Office Action issued in JP 2008-076837 on Nov. 24, 2010.
English Translation of Japanese Office Action issued in JP 2008-076837 on Nov. 24, 2010.
English Abstract of JP 2009-232625 published Oct. 8, 2009.
English Translation of JP 2009-232625 published Oct. 8, 2009.
English Abstract of JP 2007-306644 published Nov. 22, 2007.
English Translation of JP 2007-306644 published Nov. 22, 2007.
Extended European Search Report issued in EP 10177426.3 on May 4, 2011.
Extended European Search Report issued in EP 10162031.8 on Jul. 21, 2011.
Chinese Office Action mailed Jul. 21, 2011 in CN 201010178232.8.
English Language Translation of Chinese Office Action mailed Jul. 21, 2011 in CN 201010178232.8.
International Preliminary Report on Patentability and Written Opinion mailed Nov. 18, 2010 in PCT/JP2009/055871.
International Preliminary Report on Patentability and Written Opinion mailed Nov. 18, 2010 in PCT/JP2009/055873.
Japanese Office Action issued in JP 2010-213133 on Jun. 14, 2012.
English Language Translation of Japanese Office Action issued in JP 2010-213133 on Jun. 14, 2012.
English Language Abstract of JP 2009-189004 published Jul. 26, 2007.
English Language Translation of JP 2009-189004 published Jul. 26, 2007.
English Language Abstract of JP 2006-210835 published Aug. 10, 2006.
English Language Translation of JP 2006-210835 published Aug. 10, 2006.
English Language Abstract of JP 2009-123681 published Jun. 4, 20120.
English Language Translation of JP 2009-123681 published Jun. 4, 20120.
Japanese Office Action issued in JP 2010-235474 on Apr. 19, 2012.
English Language Translation of Japanese Office Action issued in JP 2010-235474 on Apr. 19, 2012.
English Language Abstract of JP 2008-504654 published Feb. 14, 2008.
English Language Translation of JP 2008-504654 published Feb. 14, 2008.
Japanese Office Action issued in JP 2010-235473 mailed Jul. 19, 2012.
English Language Translation of Japanese Office Action issued in JP 2010-235473 mailed Jul. 19, 2012.
English Language Abstract of JP 2007-042758 published Feb. 15, 2007.
English Language Translation of JP 2007-042758 published Feb. 15, 2007.
Supplementary European Search Report issued in EP 09725738 on Aug. 17, 2012.

(56) References Cited

OTHER PUBLICATIONS

Notice for Corresponding Japanese Patent Application No. 2010-196338 mailed Jul. 12, 2012.
English Translation of Notice for Corresponding Japanese Patent Application No. 2010-196338 mailed Jul. 12, 2012.
Japanese Office Action issued in JP2010-196338 mailed Jul. 26, 2012.
English Language Translation of Japanese Office Action issued in JP2010-196338 mailed Jul. 26, 2012.
European Office Action issued in EP 09725489 mailed Aug. 17, 2012.
English Language Abstract of JP 2006-054362 published Feb. 23, 2006.
English Language Translation of JP 2006-054362 published Feb. 23, 2006.
English Language Abstract of JP 2-284381 published Nov. 21, 1990.
English Language Abstract of JP 09-045481 published Feb. 14, 1997.
English Language Translation of JP 09-045481 published Feb. 14, 1997.
English Language Abstract of JP 10-064683 published Jun. 3, 1998.
English Language Translation of JP 10-064683 published Jun. 3, 1998.
European Office Action issued in EP10175037 on Sep. 7, 2012.
Extended European Search Report issued in EP 1015037 Dec. 15, 2011.
English Language Translation of CN 2854998 published Jan. 3, 2007.
European Search Report issued in EP 10174903.4 on Dec. 5, 2012.
U.S. Appl. No. 12/873,348 electronically captured on Sep. 26, 2014.
English Language Abstract of JP 2010-212267 published on Sep. 24, 2010.
Chinese Office Action issued in CN 201310225863.4 on Nov. 15, 2014.
English Language Translation of Chinese Office Action issued in CN 201310225863.4 on Nov. 15, 2014.
English Language Abstract of CN 1843061 published Oct. 4, 2006.
English Language Abstract of CN 101827477 published Sep. 8, 2010.
English Language Abstract of CN 101513122 published Aug. 19, 2009.

* cited by examiner

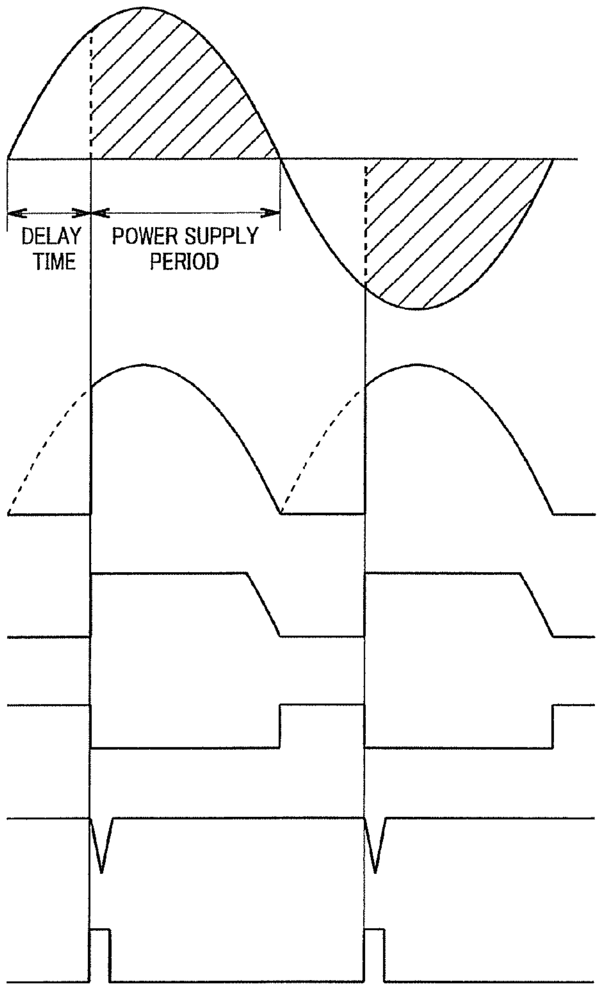
FIG.6A INPUT TO RECTIFIER CIRCUIT 12
FIG.6B OUTPUT OF RECTIFIER CIRCUIT 12
FIG.6C WAVEFORM AT POINT A
FIG.6D OUTPUT OF SCHMITT TRIGGER CIRCUIT S1
FIG.6E WAVEFORM AT POINT B
FIG.6F OUTPUT OF SCHMITT TRIGGER CIRCUIT S2

FIG.9A
FIG.9B
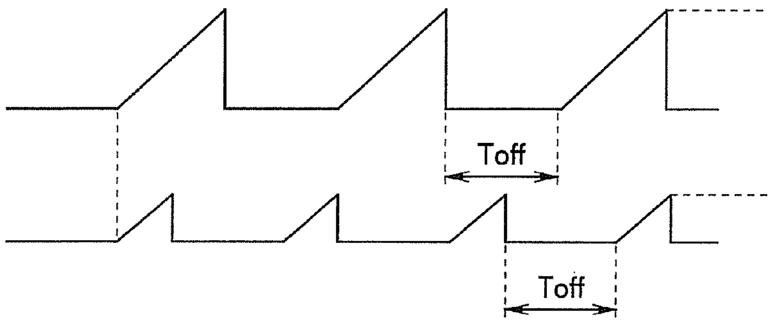
FIG.10
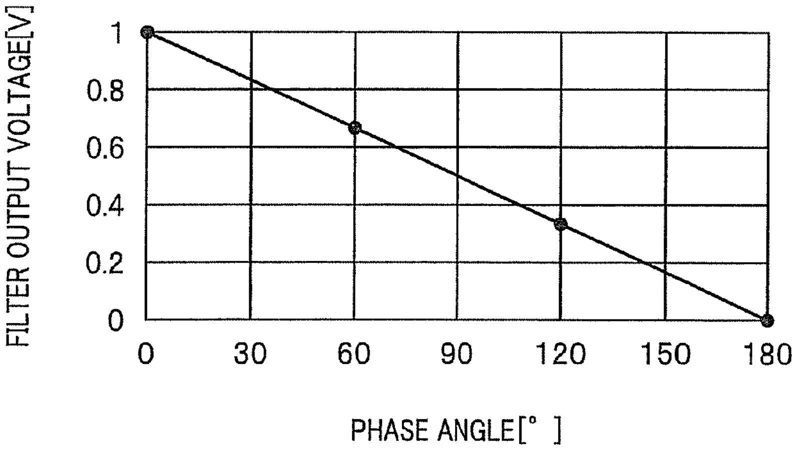

LIGHTING CIRCUIT AND ILLUMINATION DEVICE

CROSS-REFERENCE TO RELATED APPLICATION(S)

This application is a divisional of U.S. patent application Ser. No. 12/860,528, filed on Aug. 20, 2010. U.S. patent application Ser. No. 12/860,528 is based upon and claims benefit of priority from Japanese Patent Application No. 2009-192280, filed Aug. 21, 2009 and Japanese Patent Application No. 2010-135705, filed on Jun. 15, 2010. The entirety of all of the above-listed Applications are incorporated herein by reference.

FIELD

Embodiments described herein relate generally to a lighting circuit and an illumination device.

BACKGROUND

Conventionally, an illumination system in which a power source, an illumination load appliance and a controller are connected in series and the controller performs illumination control of the illumination load appliance is sometimes employed. In such illumination system, power is supplied to the illumination load appliance using two-wire wiring. The controller adjusts the power supplied to the illumination load appliance by means of a phase control method to perform dimming control (for example, Japanese Patent Application Laid-Open Publication Nos. 2007-538378 and 2005-011739).

In such two-wire wiring illumination system, e.g., a bidirectional triode thyristor (hereinafter, referred to as "TRIAC") is used as a switching element configured to perform power phase control. By turning on/off the TRIAC, the power supply from the power source to the illumination load is controlled, whereby dimming is performed. In other words, the TRIAC is turned on a period of delay time, which is based on the dimming control, from a zero crossing of the power source voltage, whereby the time of supplying power to the illumination load is controlled to perform dimming.

In such power phase control method, since the power is steeply turned on, power supply noise to be generated is large. In order to reduce the effect of such power supply noise, a noise prevention circuit including a capacitor and an inductor is employed. A dimmer including such noise prevention circuit is disclosed in, e.g., Japanese Patent Application Laid-Open No. 11-87072.

However, a resonant circuit is formed by the capacitor and the inductor included in the noise prevention circuit, and when a TRIAC, which is a switching element, is turned on, the resonant circuit causes a resonant current to flow in the TRIAC. In other words, at the time of power supply using phase control, a transient oscillation occurs, and a resonant current (transient oscillation current) having a large peak value, which flows at that time, flows also into the TRIAC. It is necessary that a relatively large holding current flow in the TRIAC to maintain conduction. No problem arises during a period in which the resonant current flows in the TRIAC in the same direction as that of the current from the power source. However, during a period in which the resonant current flows in the opposite direction, the current flowing in the TRIAC may be relatively lowered to fall below the holding current.

Even in such case, where a bulb, which has a relatively low resistance value, is employed for the illumination load, the bulb, which is the illumination load, acts as a damping resistance, whereby the resonant current is suppressed, enabling a current equal to or higher than the holding current to flow in the TRIAC.

However, where a high-resistance element, such as an LED (Light Emitting Diode), is employed for the illumination load, immediately after the TRIAC is turned on, the current flowing in the TRIAC may be reduced by the resonant current to fall below the holding current, which causes the TRIAC to be turned off. Subsequently, the TRIAC may be turned on again. In this manner, the TRIAC may be repeatedly turned on/off in a half cycle of the power source voltage according to the level and polarity of the resonant current of the time when the TRIAC is on.

In other words, there has been a problem that depending on the type of the illumination load, the TRIAC may repeatedly be turned on/off even during a period in which the TRIAC is on under normal conditions, which causes flicker in the lighting.

BRIEF DESCRIPTION OF THE DRAWINGS

FIGS. 6A to 6F are timing charts illustrating an operation of the first embodiment;

FIGS. 9A and 9B are waveform diagrams illustrating output control of a converter according to a phase angle of an AC voltage half cycle in the illumination device according to the second embodiment;

FIG. 10 is a graph illustrating a relationship between a phase angle of an AC voltage half cycle and an output of a filter in the illumination device according to the second embodiment;

DETAILED DESCRIPTION

Figure 1:
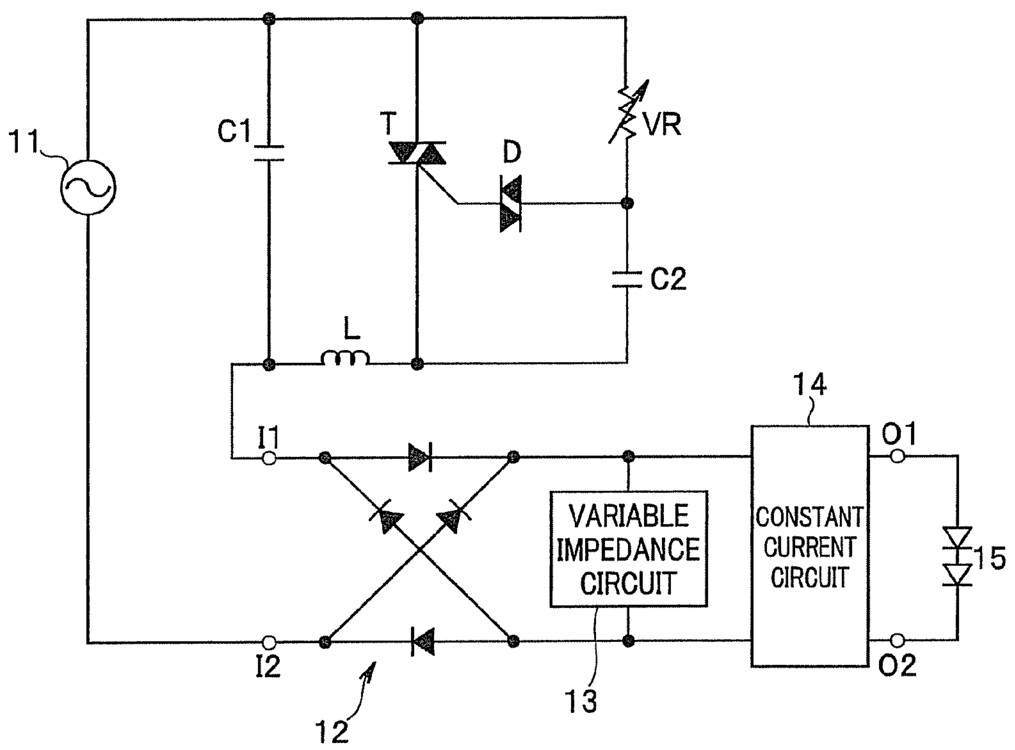
FIG. 1 is a circuit diagram illustrating an illumination device including a lighting circuit according to a first embodiment of the present invention.

Hereinafter, embodiments of the present invention will be described in detail with reference to the drawings.

A lighting circuit according to an embodiment includes: a self-hold element connected in series to an AC power source that generates power for lighting an illumination load, together with the illumination load, the self-hold element being configured to control supply of the power provided by the AC power source by the self-hold element being turned on/off; a noise prevention circuit connected in parallel to the self-hold element; and a damping circuit configured to parallely connect a damping resistance to the noise prevention circuit only for a predetermined period from turning-on of the self-hold element.

A lighting circuit according to an embodiment further includes: a rectifier circuit to which a voltage from the AC power source is applied via the self-hold element; and a constant current circuit connected in parallel to an output end of the rectifier circuit together with the damping circuit, the constant current circuit being configured to drive the illumination load.

In a lighting circuit according to an embodiment, the damping circuit includes: a clipping unit configured to clip an output of the rectifier circuit; a first schmitt trigger circuit configured to shape a waveform of an output of the clipping unit; a differentiating circuit configured to differentiate an output of the first schmitt trigger circuit; and a second schmitt trigger circuit configured to shape a waveform of an output of the differentiating circuit.

An illumination device according to an embodiment includes: the lighting circuit; and the illumination load.

An illumination device according to an embodiment includes: an input terminal; a rectifier circuit including an AC input end connected to the input terminal; an LED lighting circuit including an input end connected to DC output ends of the rectifier circuit; and a damping resistor configured to be connected to the DC output ends of the rectifier circuit only for a predetermined period at the start of application of each half wave of a power source voltage to the input terminal.

The LED lighting circuit is not specifically limited. Preferably, the LED lighting circuit includes a converter configured to perform a high-frequency operation. The converter is preferably a buck converter because an LED has a low operating voltage. However, the converter may be another known converter of various circuit types, such as a boost converter, as desired.

The damping resistor connected to the DC output ends of the rectifier circuit only for a short period of time from the start of application of a voltage in each half cycle of a power source voltage functions as means configured to damp a transient oscillation current at the start of application of the power source voltage. In other words, when a sharply-rising voltage in a half-cycle voltage of an AC voltage whose phase has been controlled by a phase-control dimmer, is applied to the illumination device, even if a transient oscillation occurs at a sharp rising part of the voltage whose phase has been controlled, the damping resistor functions as damping means for the transient oscillation. Thus, the transient oscillation is damped and the peak value of the transient oscillation current is thereby lowered. Consequently, the damping resistor is effective for preventing a phase-control dimmer from causing malfunctions at the rising in each half cycle of the power source voltage whose phase has been controlled.

It is preferable that the time of the connection of the damping resistor to the DC output ends of the rectifier circuit be within 1 ms from the start of the application of each half cycle of the power source voltage. In such length of time, the damping resistor generates only a small amount of heat, which can be ignored. Although the damping resistor has the effect of preventing the phase-control dimmer from causing malfunctions even though the time of the connection of the damping resistor exceeds 1 ms. But this is not preferable, because, with the connection time longer than the aforementioned length of time, the power loss caused by the damping resistor increases and the amount of heat generation accompanied by the power loss increases considerably.

Also, it is preferable that the connection time of the damping resistor at least include a period in which an oscillating voltage is generated, which has a relatively high peak value so that the voltage may cause malfunctions, the oscillating voltage being of a transient oscillation generated as a result of sharp rising of an AC voltage whose phase has been controlled by the phase-control dimmer. Therefore, the connection time of the damping resistor is preferably no less than around 10 μs. With such length of time, the connection of the damping resistor continues for a majority of a ½ cycle of a resonant frequency of a generally-used noise prevention circuit (30 kHz to 100 kHz), enabling provision of substantial damping operation for the transient oscillation current. More preferably, the connection time is no less than 15 μs. In order to more reliably prevent the phase-control dimmer from causing malfunctions, the connection of the damping resistor may be continued for one cycle of the resonant frequency. In other words, the connection time may be 10 μs to no less than 34 μs.

The means for connection of the damping resistor for the short period of time is not specifically limited. However, the means can be configured so that the time of the damping resistor connecting to the DC output ends of the rectifier circuit can be controlled using a switch element as desired. In such configuration, the switch element may be included in a control IC for the converter or may also be provided externally.

Furthermore, the damping resistor can be a voltage-dependent nonlinear resistor. For such a nonlinear resistor, a surge absorption element, for example, can be used. A surge absorption element is generally used for absorbing external surges such as lightning surges. Accordingly, in such a case, a surge absorption element having a high breakdown voltage that is around four times a rated AC power source voltage is used. Meanwhile, in order to employ a voltage-dependent nonlinear resistor in the embodiments to cause the damping resistor itself to control the connection time, the breakdown voltage is preferably a value close to the peak value of the AC power source voltage, that is, 1.5 to 1.6 times, more preferably 1.5 to 1.55 times a rated AC power source voltage.

In the above configuration, when the voltage-dependent nonlinear resistor broke down due to a transient oscillation generated at sharp rising of a voltage in each half cycle of an AC voltage formed by, e.g., the phase-control dimmer, the voltage-dependent nonlinear resistor absorbs the part of the transient oscillation voltage that exceeds the breakdown voltage, and consequently, the peak value of the transient oscillation current is lowered. Accordingly, when a voltage-dependent nonlinear resistor is employed for a damping resistor, the damping resistor is substantially connected to the DC output ends of the rectifier circuit when the voltage-dependent nonlinear resistor broke down.

A person skilled in the art could easily understand from the nature of the present invention that since the illumination device is an illumination device using an LED as a light source, the illumination device may have any shape. When the illumination device is used in combination with a household phase-control dimmer, a bulb-shaped LED lamp is often employed.

The illumination device according to the embodiments is effective for an LED lighting system that connects with an AC power source via a phase-control dimmer. However, the above system is not necessarily employed because the LED can be lighted without difficulty even if the illumination device according to the embodiments is used by connecting the illumination device directly to the AC power source.

An illumination device according to an embodiment further includes: a switch connected in series between a positive output end and a negative output end of the rectifier circuit, the positive output end and the negative output end being included in the DC output ends of the rectifier circuit, together with the damping resistor; and a control unit configured to detect a voltage of the DC output ends of the rectifier circuit to control on/off of the switch, thereby connecting the damping resistor to the DC output ends of the rectifier circuit.

Furthermore, in an illumination device according to an embodiment, the control unit turns on the switch using an output of a monostable circuit, the monostable circuit being configured to generate an output only for a predetermined short period of time at the start of application of each half cycle of the power source voltage.

Furthermore, in an illumination device according to an embodiment, the damping resistor includes a voltage-dependent nonlinear resistor.

In an illumination device to an embodiment, the control unit turns off the switch within 1 ms after application of each half cycle of the power source voltage.

An illumination device according to an embodiment further includes a phase-control dimmer including an input end connected to an AC power source, and an output end connected to the input terminal.

A bulb-shaped LED lamp according to an embodiment includes the aforementioned illumination device.

<First Embodiment>

Figure 2:
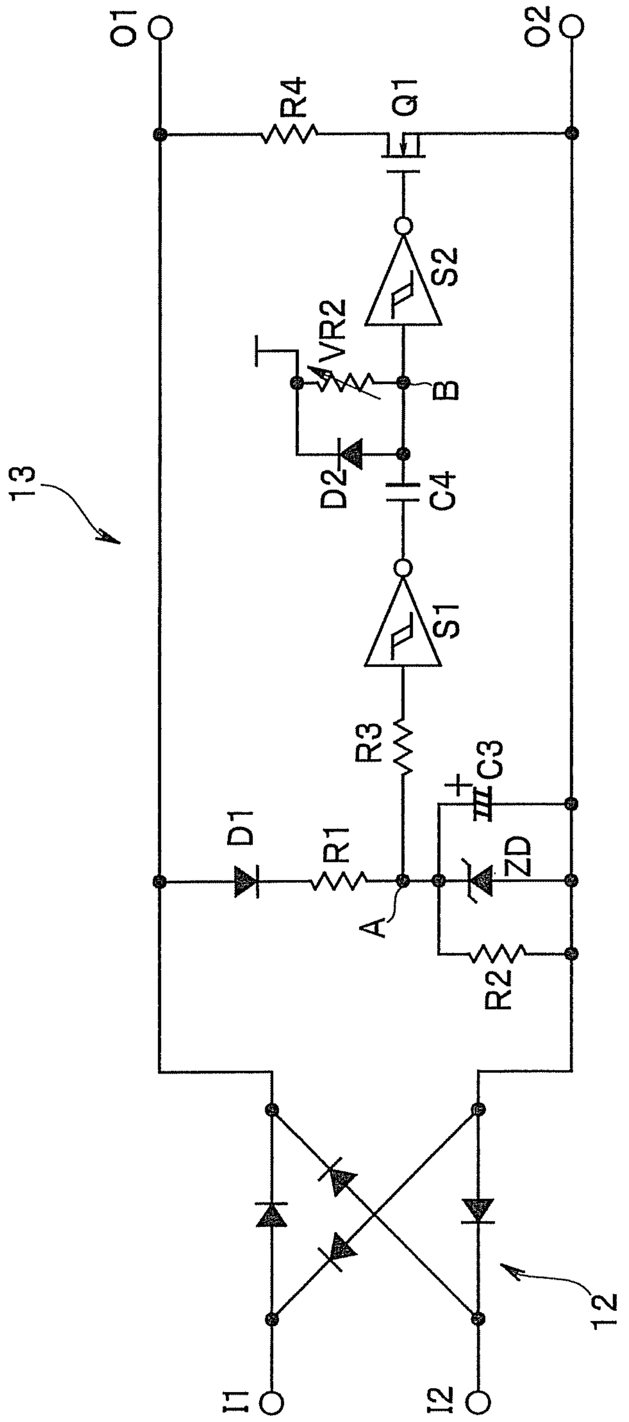
FIG. 2 is a circuit diagram illustrating a specific circuit configuration of a variable impedance circuit 13 in FIG. 1.

FIG. 1 is a circuit diagram illustrating an illumination device including a lighting circuit according to a first embodiment of the present invention. FIG. 2 is a circuit diagram illustrating a specific circuit configuration of a variable impedance circuit 13 in FIG. 1.

The illumination device illustrated in FIG. 1 supplies power from a power source 11 to an illumination load appliance connected between terminals I1 and I2 via two-wire wiring. An illumination load appliance in the present embodiment employs an LED as an illumination load 15.

Between the power source 11 and the illumination load appliance connected to the terminals I1 and I2, a TRIAC T, which performs phase control, is provided, and the power source 11, the TRIAC T and the illumination load appliance are connected in series. The power source 11 generates an AC power source voltage of, for example, 100 V. The present embodiment is described in terms of an example in which a TRIAC is used for an element for performing phase control, a thyristor, which is also a self-hold element as with a TRIAC, or another switching device may be employed.

Figure 3:
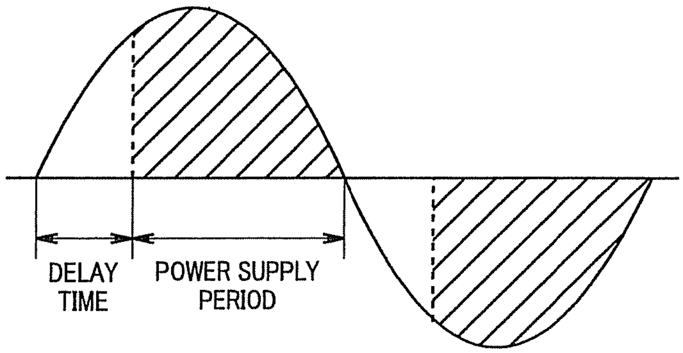
FIG. 3 is a waveform diagram with the abscissa axis indicating time and the ordinate axis indicating voltage, which illustrates an AC power source voltage of a power source 11 and control of a TRIAC T.

FIG. 3 is a waveform diagram with the abscissa axis indicating time and the ordinate axis indicating voltage, which illustrates the AC power source voltage of the power source 11 and control of the TRIAC T.

The TRIAC T is connected between the AC power source 11 and the terminal I1, and a series circuit of a variable resistance VR and a capacitor C2 is connected in parallel to the TRIAC T. The point of connection between the variable resistance VR and the capacitor C2 is connected to a control end of the TRIAC T via a bidirectional diode (hereinafter, referred to as "DIAC") D.

The variable resistance VR is configured so as to be set to have a resistance value according to the dimming control. When the TRIAC T is off, the capacitor C2 is charged by the AC power source 11 via the variable resistance VR. After a predetermined period of delay time based on the time constant of the variable resistance VR and capacitor C2 from the start of the charge of the capacitor C2, the terminal voltage of the capacitor C2 reaches a voltage allowing the DIAC D to be turned on. Consequently, pulses are generated in the DIAC D and supplied to the control end of the TRIAC T. Consequently, the TRIAC T is brought into conduction.

The TRIAC T maintains conduction as a result of being supplied with a current from the power source 11. During the period in which the TRIAC T is on, the capacitor C2 is discharged, and the TRIAC T is turned off when its holding current is not maintained. When the polarity of the power source voltage applied to the TRIAC T is inversed, the capacitor C2 is charged again, the DIAC D is turned on after the elapse of the delay time. Consequently, the TRIAC T is turned on after a predetermined period of delay time from a zero crossing of the AC power source voltage. Subsequently, the operation is repeated in a similar manner, during a period of a power supply cycle with the delay time excluded (hereinafter, referred to as "power supply period"), the power from the power source 11 is supplied to the illumination load appliance via the TRIAC T.

The AC waveform illustrated in FIG. 3 indicates a voltage generated by the power source 11. The shaded areas each indicate a power supply period during which the TRIAC T is brought into conduction. The delay time can be adjusted by changing the resistance value of the variable resistance VR.

A noise prevention circuit including a capacitor C1 and a coil L is connected to opposite ends of TRIAC T. The noise prevention circuit prevents noise from leaking into the power source 11 side.

A rectifier circuit 12 is provided between the terminals I1 and I2. The rectifier circuit 12 may be, for example, a diode bridge. The rectifier circuit 12 rectifies a voltage supplied to the terminals I1 and I2 and outputs the voltage.

Outputs appearing at one output end and another output end of the rectifier circuit 12 are supplied to a constant current circuit 14. The constant current circuit 14 generates a constant current from the outputs of the rectifier circuit 12, and supplies the constant current to the illumination load 15 via terminals O1 and O2. For the illumination load 15, for example, an LED may be employed. As a result of the time of voltage supply to the rectifier circuit 12 being controlled by the TRIAC T, the value of the constant current from the constant current circuit 14 varies according to the on time of the TRIAC T. Consequently, the brightness of the illumination load 15 is controlled by dimming.

The noise prevention circuit inserted to prevent leakage of power supply noise forms a resonant circuit, which makes a resonant current flow in the TRIAC T during the TRIAC T being on.

Figure 5:
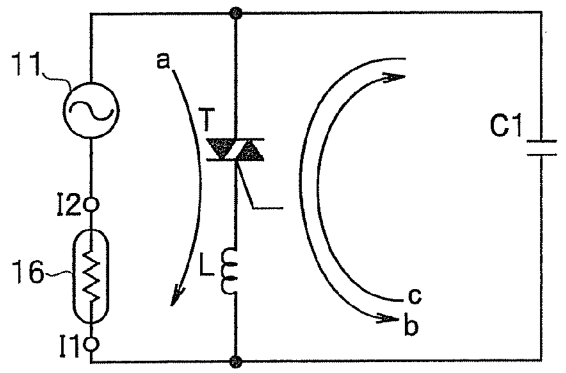
FIG. 5 is a circuit diagram illustrating an effect of a resonant current.
Figure 4:
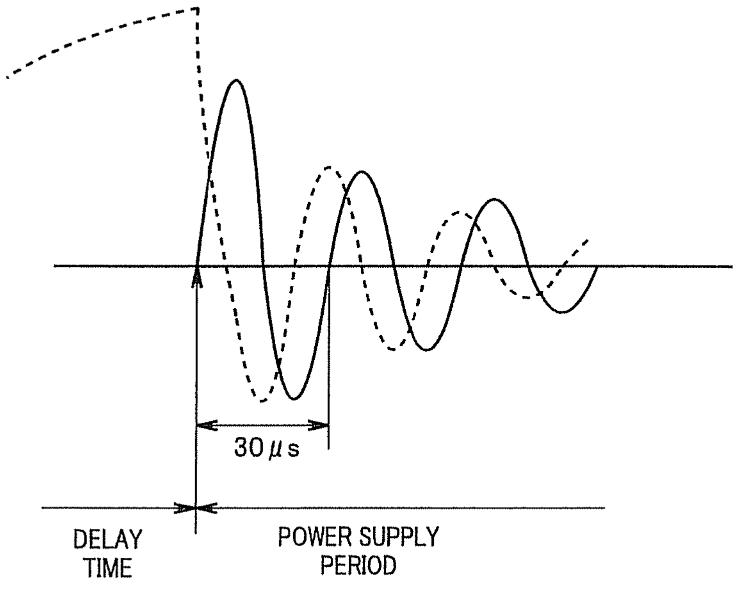
FIG. 4 is a waveform diagram with the abscissa axis indicating time and the ordinate axis indicating voltage and current, which illustrates a resonant voltage (dashed line) and a resonant current (solid line)

FIG. 4 is a waveform diagram with the abscissa axis indicating time and the ordinate axis indicating voltage and current, which illustrates a resonant voltage (dashed line) and a resonant current (solid line). FIG. 5 is a circuit diagram illustrating an effect of a resonant current. FIG. 5 is a simplified diagram of FIG. 1, and indicates an example in which an illumination load appliance 16 is connected between terminals I1 and I2.

The resonance frequency of the noise prevention circuit is around 30 kHz to 100 kHz, and the resonance cycle is sufficiently short compared to the AC cycle of the power source 11. As illustrated in FIG. 5, when the TRIAC T is on, during a period in which a current a flows into the TRIAC T from the power source 11, a resonant current b having a same direction as that of the current a and a resonant current c having a direction opposite to that of the current a flow. Even in the power supply periods illustrated in the shaded area in FIG. 3, the TRIAC T is turned off when a current that is the sum of the current a and the resonant current c falls below the holding current of the TRIAC T.

As illustrated in FIG. 4, the level of the resonant current immediately after the TRIAC T being turned on after the elapse of the delay time is relatively large, and also, when an LED is used for the illumination load appliance, the resistance value of the illumination load appliance is a relatively large. Thus, immediately after the TRIAC T is turned on, the TRIAC T is turned off by the resonant current. The TRIAC T is turned on again by the capacitor C2 being charged, and thus, even during a power supply period, the TRIAC T is repeatedly turned on/off for a period of time according to the level of the resonant current. The resonant current and resonant voltage waveforms in FIG. 4 represent only the resonant condition of the noise prevention circuit, and a current component flowing into the illumination load 15 (current component a in FIG. 5) from the power source 11 via the TRIAC T is excluded. Accordingly, the waveform of a current actually flowing in the TRIAC T is the resonant current waveform in FIG. 4 plus the component a from the power source 11.

Also, a holding current of a TRIAC is several tens of milliamperes (30 mA to 50 mA). In a period close to a zero-crossing of the AC voltage, the current flowing in the TRIAC T becomes relatively small. However, when a bulb is used for the illumination load, the resistance of the bulb during dimming also become small, and thus, even during dimming, a sufficient current flows in the TRIAC T, thereby the holding current being maintained.

On the other hand, when an LED, which is a high-resistance element, is employed for the illumination load, during dimming, the current flowing in the TRIAC T becomes relatively small, and thus, the effect of the resonant current flowing in the TRIAC T becomes large.

Therefore, in the present embodiment, a variable impedance circuit 13 is provided as a damping circuit that suppresses the effect of the resonant current. In the present embodiment, the variable impedance circuit 13 is provided between the output end and the other output end of the rectifier circuit 12, that is, in parallel to the resonant circuit formed by the noise prevention circuit.

The variable impedance circuit 13 includes, for example, a switch element and a resistive element, and the resistive element is connected between the output end and the other output end of the rectifier circuit 12 only for a period in which the switch element is on. For example, only for one resonance cycle from the start of a power supply period, the switch element is turned on to make the resonant current flow in the resistive element, whereby the resonance is damped to reduce the peak value of the resonant current, enabling a sufficient current exceeding the holding current to flow in the TRIAC T even when the resonant current (current c) flows in a direction opposite to that of the current a.

FIG. 2 indicates an example in which an FET Q1 is employed for the switch element and a resistance R4 is employed for the resistive element. A 100 W bulb for a 100 V AC power source has a resistance value of 100Ω under a dimming control to 100%, and a cold resistance is around 1/10 to 1/20 of the resistance value. In other words, during dimming, the resistance value of the bulb is several tens of ohms, and the bulb acts as a damping resistance. In the present embodiment, the resistance value of the resistance R4 is similar to the resistance value of the bulb during dimming. Consequently, the resistance R4 acts as a damping resistance, and sufficiently suppresses the effect of the resonant current.

In FIG. 2, the resistance R4 and a drain-source path of the FET Q1 are connected between the output end and the other output end of the rectifier circuit 12. A series circuit of a diode D1, a resistance R1 and a zener diode ZD is also connected between the output end and the other output end of the rectifier circuit 12. A resistance R2 and a capacitor C3 are connected in parallel to the zener diode ZD.

A point of connection between the resistance R1 and the zener diode ZD (hereinafter referred to as "point A") is connected to a negative logic schmitt trigger circuit S1 via a resistance R3. An output of the rectifier circuit 12 appears at the point A via the diode D1 and the resistance R1. The voltage at the point A is clipped to a predetermined level by the zener diode D1 and the capacitor C3.

The schmitt trigger circuit S1, which shapes the waveform of an input voltage, outputs a rectangular wave that falls when the output of the rectifier circuit 12 rises, and rises from a zero crossing. An output end of the schmitt trigger circuit S1 is connected to a power source terminal via a capacitor C4 and a variable resistance VR2. A diode D2 is connected in parallel to the variable resistance VR2. A differentiating circuit is formed by the capacitor C4, the variable resistance VR2 and the diode D2, and at a point of connection between the capacitor C4 and the variable resistance VR2 (hereinafter referred to as "point B"), a waveform obtained as a result of differentiating an output of the schmitt trigger circuit S1 appears.

The waveform at the point B is supplied to an input end of a negative logic schmitt trigger circuit S2. The schmitt trigger circuit S2, which shapes the waveform of an input voltage, outputs pulses rising when an output of the differentiating circuit falls. The pulse width of the output pulses of the schmitt trigger circuit S2 can be adjusted by changing the resistance value of the variable resistance VR2.

The output of the schmitt trigger circuit S2 is supplied to a gate of the FET Q1. The FET Q1 is turned on by the high-level pulses supplied to the gate to connect the resistance R4 between the output end and the other output end of the rectifier circuit 12. In other words, the resistance R4 is connected between the output end and the other output end of the rectifier circuit 12 only for a period determined by a constant of the differentiating circuit from rising of the output of the rectifier circuit 12.

Next, an operation of the embodiment configured as described above will be described with reference to the timing charts illustrated in FIGS. 6A to 6F. FIG. 6A illustrates an input to the rectifier circuit 12, FIG. 6B illustrates an output of the rectifier circuit 12, FIG. 6C illustrates a waveform at the point A, FIG. 6D illustrates an output of the schmitt trigger circuit S1, FIG. 6E illustrates an output of the differentiating circuit (waveform at point B), and FIG. 6F illustrates an output of the schmitt trigger circuit S2.

An AC voltage from the power source 11 is supplied to the illumination load appliance between the terminals I1 and I2 through the TRIAC T via the two-wire wiring. The TRIAC T is brought into conduction after the elapse of the delay time, which is based on the time constant of the variable resistance VR and the capacitor C2 from a zero crossing of the power source voltage, and provides power to the illumination load appliance during a power supply period.

Now, it is assumed that power is supplied from the TRIAC T between the terminals I1 and I2 during the shaded power supply periods in FIG. 6A. The rectifier circuit 12, as illustrated in FIG. 6B, outputs a positive voltage. The output of the rectifier circuit 12 is provided to the variable impedance circuit 13.

At the point A in the variable impedance circuit 13, a waveform obtained as a result of the output of the rectifier circuit 12 being clipped to a predetermined level based on the zener diode ZD and the capacitor C3 (FIG. 6C) appears. The waveform is supplied to the schmitt trigger circuit S1 via the resistance R3. The schmitt trigger circuit S1 shapes the input waveform, and outputs a waveform that falls as the input waveform rises and rises from a zero crossing.

The output of the schmitt trigger circuit S1 is supplied to the differentiating circuit formed by the capacitor C4, the variable resistance VR2 and the diode D2. The differentiating circuit outputs a waveform that falls and rises at the inclination based on the time constant of the capacitor C4 and the variable resistance VR2 as the output of the schmitt trigger circuit S1 falls (FIG. 6E). Because of the presence of the diode D2, the output of the differentiating circuit does not change as the output of the schmitt trigger circuit S1 rises.

The timing of the output of the rectifier circuit 12 rising, that is, the timing of TRIAC T being turned on is detected by the differentiating circuit. The output of the differentiating circuit is supplied to the schmitt trigger circuit S2, and the schmitt trigger circuit S2 outputs a pulse-formed waveform that rises and falls as the output of the differentiating circuit falls and rises (FIG. 6F). The pulse width of the output pulse of the schmitt trigger circuit S2 can be adjusted by the inclination of the output of the differentiating circuit, that is, the resistance value of the variable resistance VR2.

The output of the schmitt trigger circuit S2 is supplied to the FET Q1, and the FET Q1 is turned on during a positive pulse period of the schmitt trigger circuit S2 to connect the resistance R4 between the output end and the other output end of the rectifier circuit 12.

Accordingly, the resistance R4 is connected between the output end and the other output end of the rectifier circuit 12, that is, in parallel to the resonant circuit during the pulse periods in FIG. 6F in which the output is at a high level during a period of time determined by the time constant of the differentiating circuit from the turning-on of the TRIAC T. The resistance value of the resistance R4 is set to, for example, a resistance value equivalent to a resistance value during dimming when a bulb is used for the illumination load, and the resistance R4 acts as a damping resistance configured to make the resonant current of the resonant circuit formed by the capacitor C1 and the coil L flow therein. Consequently, the resonant current that flows in the TRIAC T is suppressed, enabling the on state of the TRIAC T to be maintained.

Since a resonant current attenuates with time, the resistance R4, which is a damping resistance, may be connected in parallel to the resonant current only for a predetermined period from the turning-on of the TRIAC T. More specifically, the resistance R4 is connected in parallel to the resonant circuit only for one cycle from occurrence of the resonant current illustrated in FIG. 4, enabling the effect of the resonant current to be effectively suppressed.

As illustrated in FIG. 4, when the resonant current is positive, the resonant current flows in a same direction as that of the current flowing from the power source 11 into the TRIAC T, and thus, it is not necessary to connect the resonant circuit to the resistance R4 simultaneously with the turning-on of the TRIAC T. The resistance R4 only needs to be connected in parallel to the resonant circuit by the elapse of a half cycle of the resonant current from the turning-on of the TRIAC T.

The resistance R4 is connected between the output end and the other output end of the rectifier circuit 12 only for the positive pulse periods illustrated in FIG. 6F, enabling power wastefully consumed by the resistance R4 to be suppressed to the minimum.

As described above, in the present embodiment, when the TRIAC is turned on, a resistance for damping is inserted in parallel to the resonant circuit for a predetermined period of, e.g., around one cycle of a resonant current to suppress the resonant current flowing in the TRIAC, enabling prevention of the TRIAC from being turned off by the effect of the resonant current. Consequently, the TRIAC is on continuously during a power supply period according to dimming control, enabling provision of lighting with no flicker.

Although the above-described embodiment has been described in terms of an example in which a variable impedance circuit is provided between output ends of a rectifier circuit, the variable impedance circuit only needs to be provided in parallel to a resonant circuit, and thus, it is clear that the variable impedance circuit may be provided, for example, on the input side of the rectifier circuit, that is, between the terminals I1 and I2.

Also, the terminals I1 and I2 may include terminal fittings or may also be mere conductive wires. Where the illumination device is a bulb-shaped LED lamp including a base, the base functions as an input terminal.

<Second Embodiment>

Figure 7:
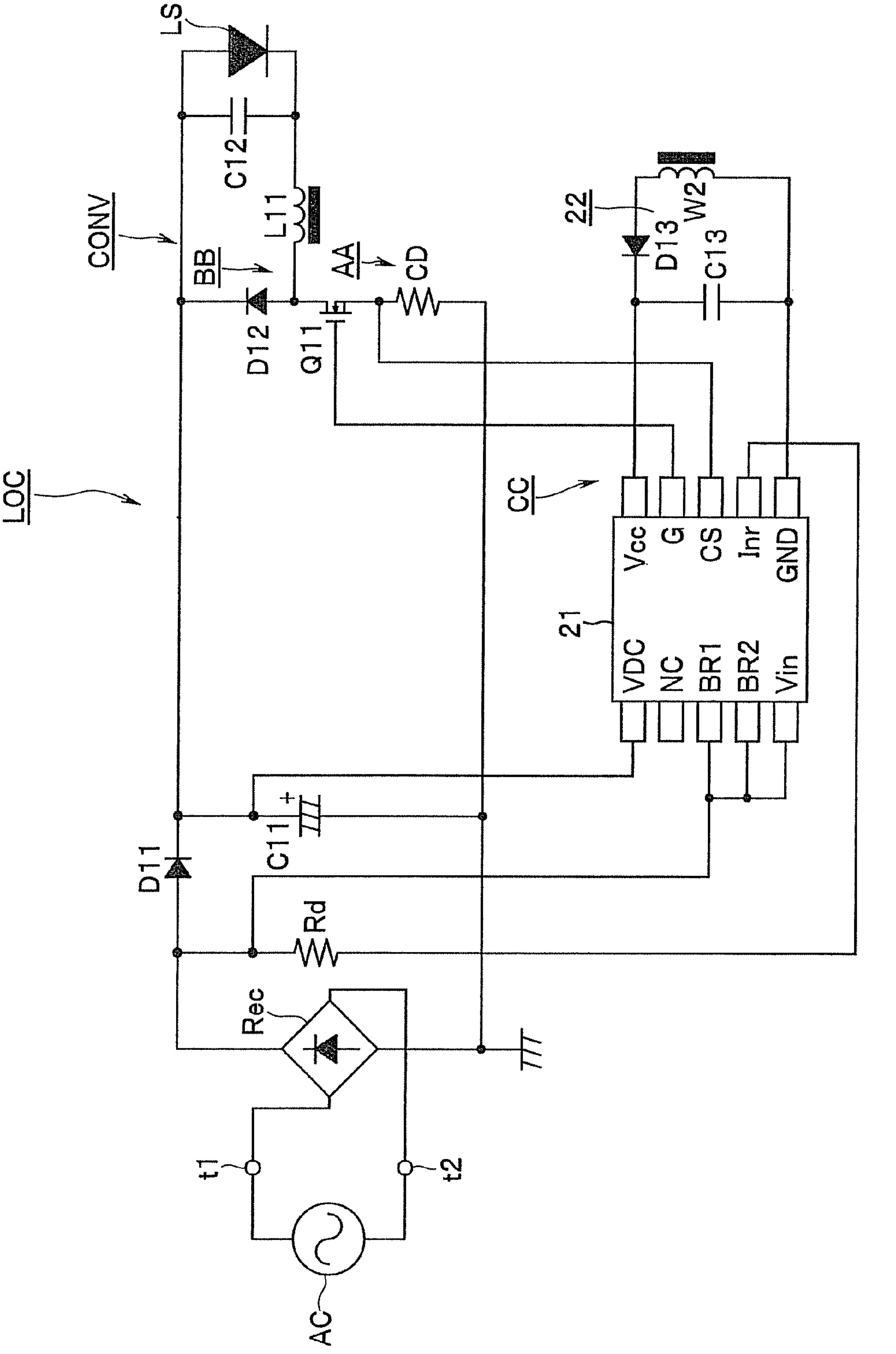
FIG. 7 is a circuit diagram of an illumination device according to a second embodiment of the present invention.

A second embodiment of the present invention will be described. In the second embodiment, as illustrated in FIG. 7, an illumination device includes input terminals t1 and t2, a rectifier circuit Rec, an LED lighting circuit LOC, and an LED LS, which is a load, and a damping resistor Rd.

The input terminals t1 and t2 are means configured to connect the illumination device to an AC power source AC, for example, a commercially-available 100V AC power source. The AC power source AC may be connected to the illumination device via or not via a known phase-control dimmer, which is not illustrated, as described above.

Furthermore, the input terminals t1 and t2 may include terminal fittings, or may also be mere conductive wires. Where the illumination device is a bulb-shaped LED lamp including a base, the base functions as an input terminal.

A rectifier circuit Rec is means configured to convert an AC to a DC, and includes AC input ends and DC output ends. The AC input ends are connected to the input terminals t1 and t2. A person skilled in the art should know that the AC input ends are connected to the input terminals t1 and t2 via noise filters (not illustrated), which should therefore be allowed.

Also, the rectifier circuit Rec is not limited to a full-wave bridge rectifier circuit as illustrated, and it is allowed to arbitrarily select and use a known rectifier of various circuit types as desired. Furthermore, the rectifier circuit Rec can include smoothing means. For example, a smoothing capacitor C11 including, e.g., an electrolytic capacitor as illustrated in the Figure, can be connected to the DC output end for the LED lighting circuit LOC directly or in series via a diode D11 as illustrated in the Figure.

The LED lighting circuit LOC only needs to be circuit means configured to light LED LS, which will be described later, and no specific configuration of the LED lighting circuit LOC is particularly limited. However, for, e.g., circuit efficiency enhancement and easy control, it is preferable to employ a configuration including a converter CONV as its main component. The illustrated converter CONV indicates an example using a buck chopper.

The converter CONV, which includes a buck chopper, includes first and second circuits AA and BB, and a control unit CC. The first and second circuits AA and BB include a switching element Q11, an inductor L11, a diode D12, an output capacitor C12 and a current detection element CD as their elements.

In the first circuit AA, a series circuit of the switching element Q11, the inductor L11, the current detection element CD and the output capacitor C12 is connected to the DC output end of the rectifier circuit Rec whose output voltage has been smoothed. When the switching element Q11 is turned on, an increasing current, which linearly increases, flows from the DC output end of the rectifier circuit Rec, and electromagnetic energy is accumulated in the inductor L11. The current detection element CD is connected to the position illustrated in FIG. 7 so as to detect the increasing current.

The second circuit BB includes a closed circuit of the inductor L11, the diode D12 and the output capacitor C12. When the switching element Q11 of the first circuit AA is off, the electromagnetic energy accumulated in the inductor L11 is released and a decreasing current flows in the closed circuit.

The LED LS is connected in parallel to the output capacitor C12 of the converter CONV.

Figure 8:
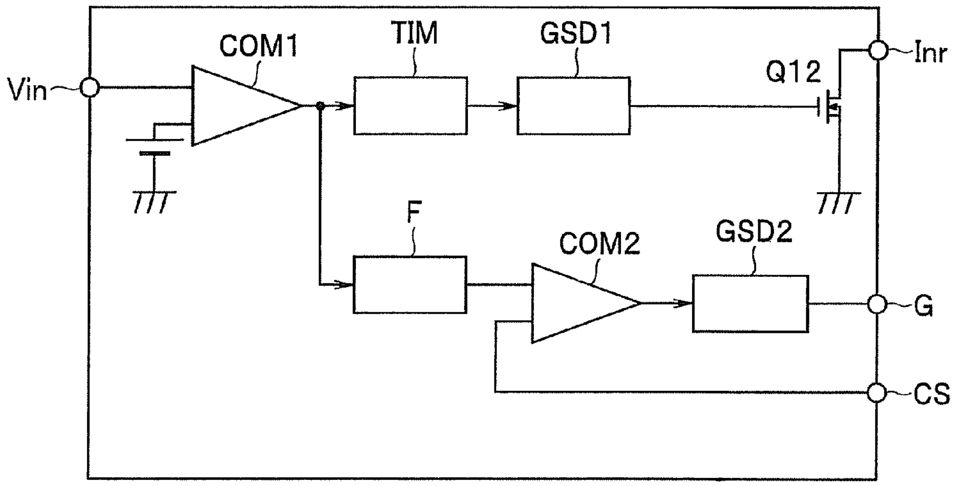
FIG. 8 is a circuit diagram of a part of the illumination device according to the second embodiment, the part controlling a damping resistor and a converter.

FIG. 8 is a circuit diagram illustrating a part of a circuit in a control C21 in FIG. 7.

The damping resistor Rd is connected between the non-smooth DC output ends of the rectifier circuit Rec via a switch element Q12 illustrated in FIG. 8. Where the illumination device is for a commercially-available 100V AC power source, the resistance value of the damping resistor Rd can be set to around several hundreds of ohms. The switch element Q12 may be included in the control IC 21 as illustrated in FIG. 8 or may also be an external component for the control IC 21 as described later.

In the present embodiment, the control unit CC is means configured to control the LED lighting circuit LOC and the damping resistor Rd. The control unit CC includes a control IC 21 and a control power source 22.

The control IC 21 includes a plurality of pin terminals, a pin VDC is connected to a positive electrode of the smoothing capacitor C11 for the rectifier circuit Rec, a pin Vin is connected to the positive side of the damping resistor Rd, a pin Vcc is connected to a positive terminal of the control power source 22, a pin G is connected to the switch element Q11 of the converter CONV, a pin CS is connected to a detection output end of the current detection element CD, a pin Inr is connected to the negative side of the damping resistor Rd, and a pin GND is connected to a negative terminal of the control power source 22.

Furthermore, in the second embodiment, the control IC 21, which controls the time of connection of the damping resistor Rd to the output ends of the rectifier circuit Rec, includes a switch element Q12, and also includes a control circuit for the switch element Q12, which will be described below.

The control circuit for the switch element Q12, as illustrated in FIG. 8, is configured to detect a non-smooth DC output voltage of the rectifier circuit Rec, which is input from the pin Vin, using a comparator COM1, and turn the switch element Q12 on via a timer TIM and a driver GSD1 only for a predetermined short period of time as each half cycle of a power source voltage rises. For example, the control circuit in FIG. 8 turns the switch element Q12 off within 1 ms after application of each half cycle of the power source voltage.

Also, the comparator COM1, as illustrated in FIG. 8, controls the switching element Q11 of the converter CONV via a filter F, a comparator COM2 and a driver GSD2 to control an output of the converter CONV so as to adjust a conduction angle for each half cycle of the power source voltage. An output (voltage) of the filter F, as illustrated in FIG. 10, varies according to the conduction phase angle, and the output voltage of the filter F is a reference voltage for the comparator COM2. When a detection value from the current detection element CD reaches the reference voltage, the comparator COM1 turns off the switching element Q11 of the converter CONV.

The control power source 22, which includes a secondary winding w2 to be magnetically coupled to the inductor L11 of the converter CONV, rectifies an induced voltage in the secondary winding w2, which is generated when an increasing current flows in the inductor L11, by means of a diode D13 and smoothes the rectified induced voltage by means of a capacitor C13 to output a control voltage between the pin Vcc and the pin GND of the control IC 21.

Next, a circuit operation will be described.

The control IC 21 in the control unit CC is provided with a function that, when AC power for the illumination device is applied, acts so as to first receive a control power supply from the pin VDC to start the converter CONV, and thus, the converter CONV is promptly started. Once the converter CONV is started, a gate signal is supplied to a gate of the switching element Q11 from the pin G of the control IC 21 for the converter CONV to start a buck chopper operation. Then, as a result of an increasing current flowing in the inductor L11, a voltage is induced in the secondary winding w2 magnetically coupled to the inductor L11, and thereafter, the operation is continuously performed with control power supply provided from the control power source 22.

Consequently, the LED LS connected in parallel to the output capacitor C12 of the converter CONV is driven to light up. When the detection output from the current detection element CD is input to the pin CS of the control IC 21 as a control input, the converter CONV performs a negative feedback control operation for the increasing current within the control IC 21. Then, an output current of the converter CONV is proportional to the increasing current, and the LED LS lights up under a constant current control.

Meanwhile, when an AC power source voltage is applied, the timer TIM in the control IC 21 generates a gate signal from the driver GSD1 to turn on the switch element Q12 simultaneously with the comparator COM1's detection of a non-smooth DC output voltage, and thus, immediately after the power application, the damping resistor Rd is connected between the DC output ends of the rectifier circuit Rec.

Consequently, as a result of interposing a phase-control dimmer between the AC power source AC and the illumination device according to the present embodiment, when each half cycle of the power source voltage sharply rises, even though a transient oscillation occurs for the reason described above, the damping resistor Rd damps the transient oscillation. Consequently, the peak value of the transient oscillation is lowered, and thus, a phase-control dimmer causes no malfunctions, enabling provision of desired dimmed illumination.

After the elapse of a predetermined short period of time from the start of application of the voltage of each half cycle of the power source voltage, the timer TIM stops the driver GSD1's gate signal generation, and thus, the damping resistor Rd is released from between the DC output ends of the rectifier circuit Rec. Therefore, the heat generation caused by the power consumed by the damping resistor Rd is extremely small.

Next, an operation in which the LED lighting circuit LOC controls its output so as to adjust to the conduction angle control by the phase-control dimmer to dim and light the LED LS will be described with reference to FIGS. 8 to 10.

In other words, in FIG. 8, when each half cycle of the power source voltage is applied between the input terminals and a non-smooth DC output voltage of the rectifier circuit Rec is input from the pin Vin of the control IC, a gate signal is supplied to the switching element Q11 via the comparator COM1, the filter F, the comparator COM2 and the driver GSD2, to drive the switching element Q11 to be turned on. When the switching element Q11 is turned on, an increasing current flows in the first circuit AA in the converter CONV, and the current detection element CD detects the increasing current, and thus, the detection output is input from the pin CS of the control IC.

Meanwhile, the filter F integrates the half cycle of the power source voltage to perform effective value conversion, and outputs a voltage with the relationship illustrated in FIG. 10 as described above. Then, at the point of time when the detection output from the pin CS corresponds to the output voltage of the filter F, the comparator COM2 stops sending a gate signal from the driver GSD2. As a result, the switching element Q11 of the converter CONV is turned off. Consequently, a decreasing current from the inductor L11 flows in the second circuit BB. In the present embodiment, off time Toff of switching element Q11 illustrated in FIGS. 9A and 9B is fixed, and when the off time has elapsed, the driver GSD2 starts operating, and the switching element Q11 is turned on again. Subsequently, the above-described operation is repeated, and thus, the converter CONV continues the operation to generate an output corresponding to the conduction angle of the power source voltage.

FIG. 9A illustrates an example of a waveform appearing at the pin CS of the control IC where the conduction angle of the power source voltage is 180°, that is, the phase angle is 0°.

FIG. 9B illustrates an example of a waveform appearing at the pin CS of the control IC where the conduction angle of the power source voltage is 90°, that is, the phase angle is 90°.

In both of the above examples, when the detection output of the current detection element CD (input to the pin CS) reaches the output voltage level of the filter F, which is indicated by dotted lines in the Figures, the comparator COM2 stops sending a gate signal from the driver GSD2, and thus, it can be understood that an output of the converter CONV varies according to the conduction angle of the power source voltage.

FIG. 10 is a graph illustrating a relationship between a phase angle of the power source voltage and an output of the filter, which are set to be proportional to each other in the present embodiment.

<Third Embodiment>

Figure 11:
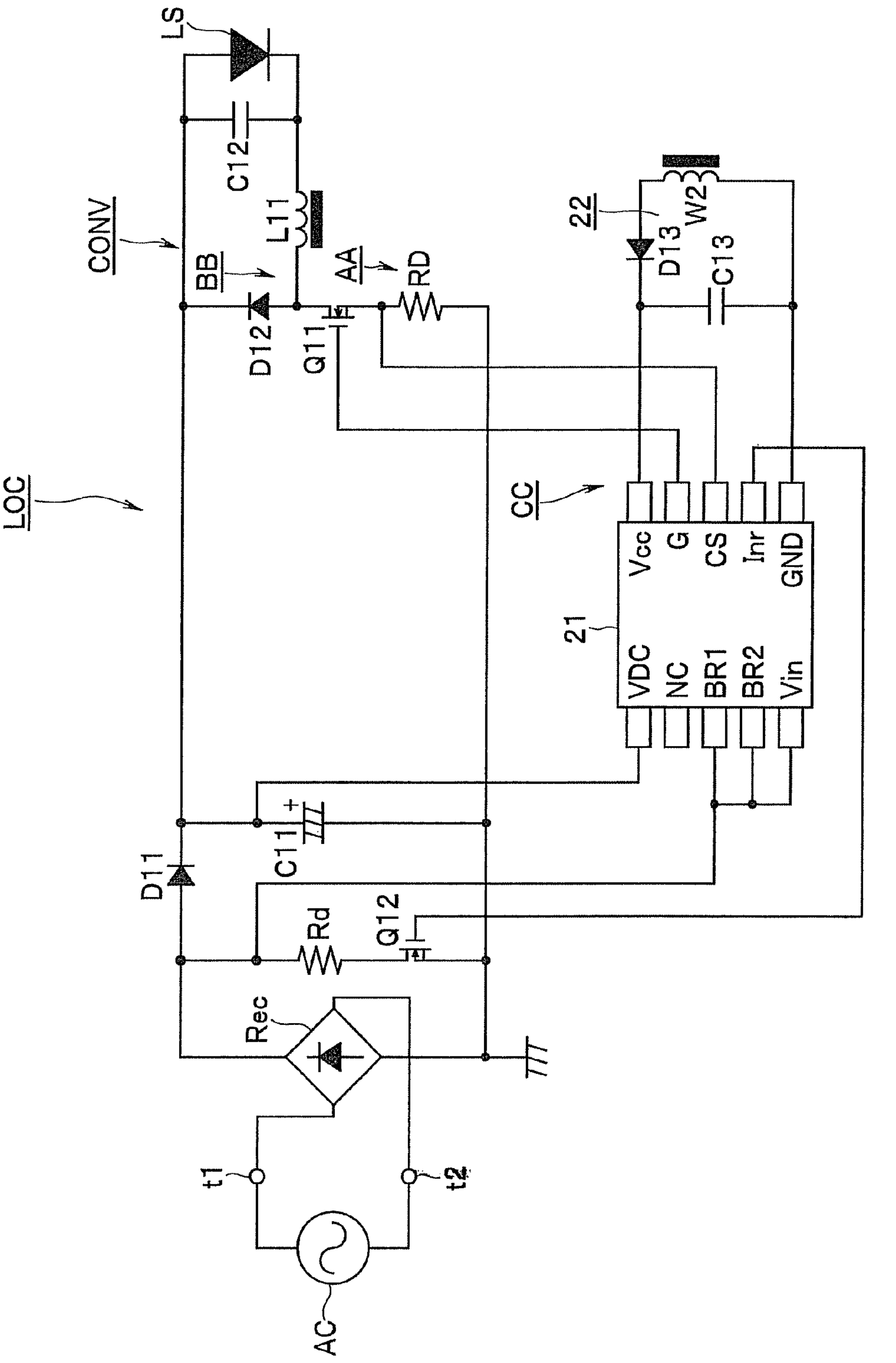
FIG. 11 is a circuit diagram of an illumination device according to a third embodiment of the present invention.
Figure 12:
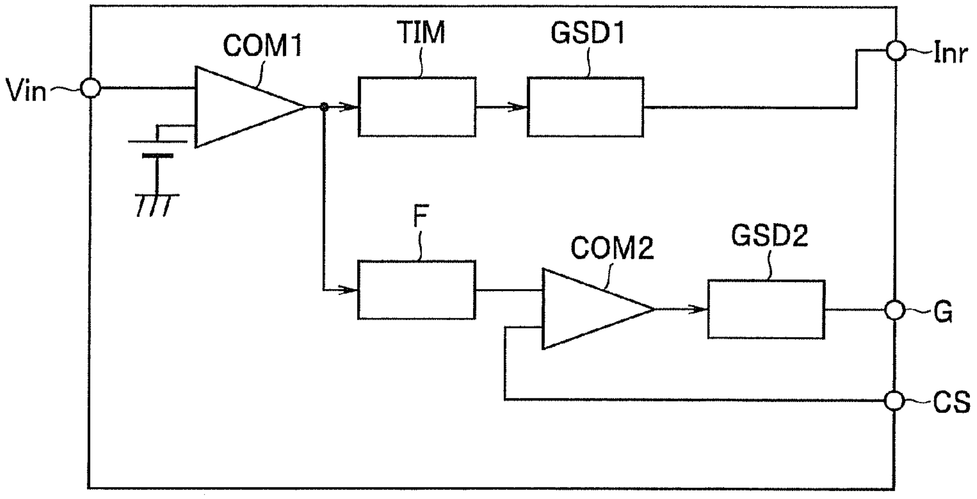
FIG. 12 is a circuit diagram of a part of the illumination device according to the third embodiment, the part controlling a damping resistor and a converter.

A third embodiment of the present invention will be described. In the third embodiment, as illustrated in FIGS. 11 and 12, a switch element Q12 configured to control the connection time of a damping resistor Rd is provided external to a control IC 21. Accordingly, only a control circuit for the damping resistor Rd is included in the control IC 21. In the Figures, the same components as those in FIGS. 7 and 8 are provided with the same symbols, and a description of those components will be omitted.

<Fourth Embodiment>

Figure 13:
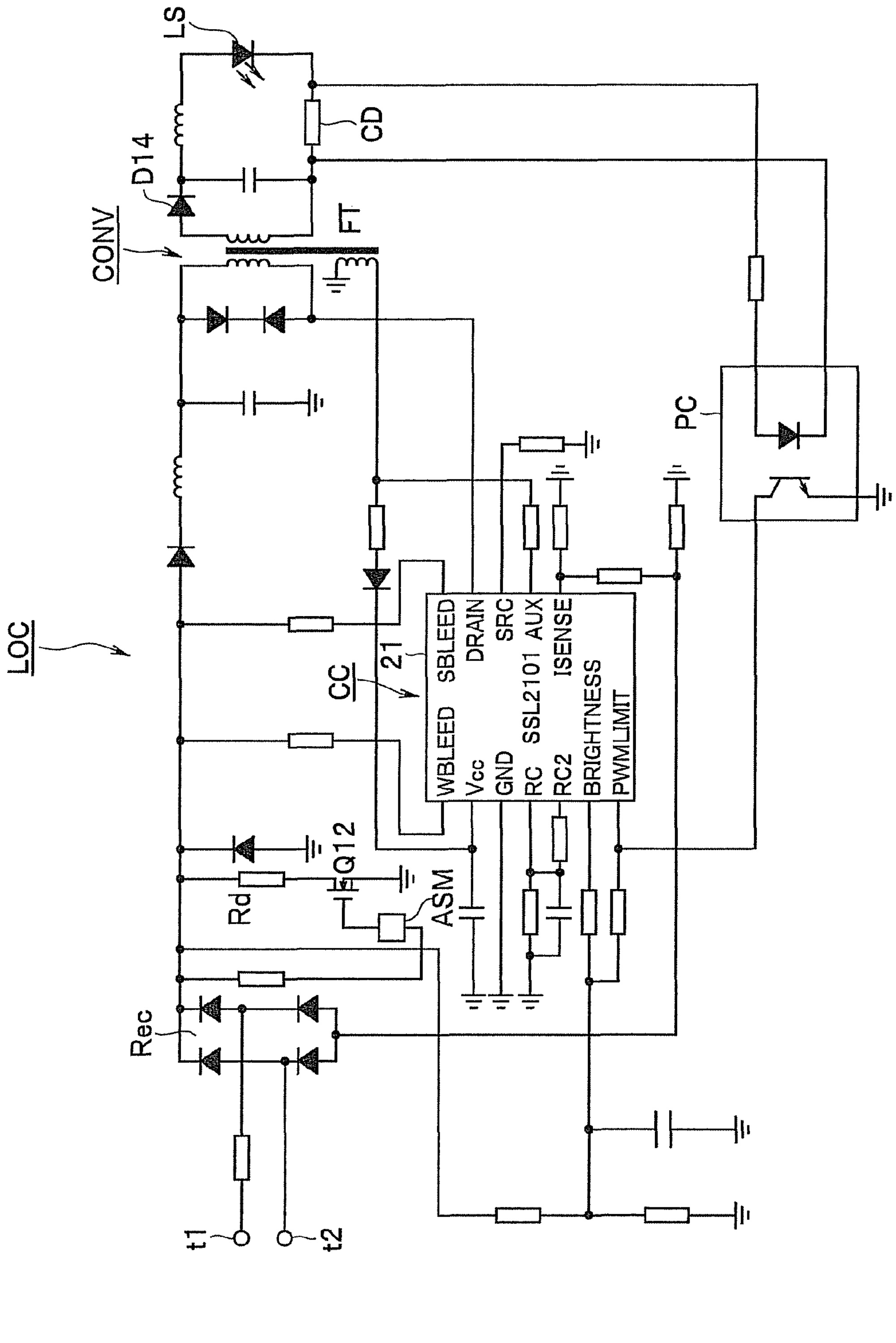
FIG. 13 is a diagram of an illumination device according to a fourth embodiment of the present invention.

A fourth embodiment of the present invention will be described. The fourth embodiment, as illustrated in FIG. 13, is different from the second and third embodiments in terms of a control circuit for a damping resistor Rd, and a converter CONV. In the Figure, the same components as those in FIG. 7 are provided with the same symbols, and a description of those components will be omitted.

The control circuit for the damping resistor Rd is configured to turn on a switch element Q12 by means of an output of a monostable circuit ASM configured to generate an output only for a predetermined short period of time at the start of application of each half cycle of a power source voltage.

The converter CONV is of a flyback transformer-type. In other words, a buck-flyback converter CONV includes a switching element (not illustrated) included in a control IC 21, a flyback transformer FT, a diode D14, a current detection element CD and the control IC 21 as its main components. The switching element turns on/off the connection of a primary winding in the flyback transformer FT to a DC output end of a rectifier circuit Rec. The diode D14 rectifies a voltage induced in a secondary winding in the flyback transformer FT to obtain a DC output. The current detection element CD feeds an output current obtained from the secondary side of the flyback transformer FT back to the control C21 via a photocoupler PC. The control IC 21 performs constant current control of the converter CONV to light an LED LS.

<Fifth Embodiment>

Figure 14:
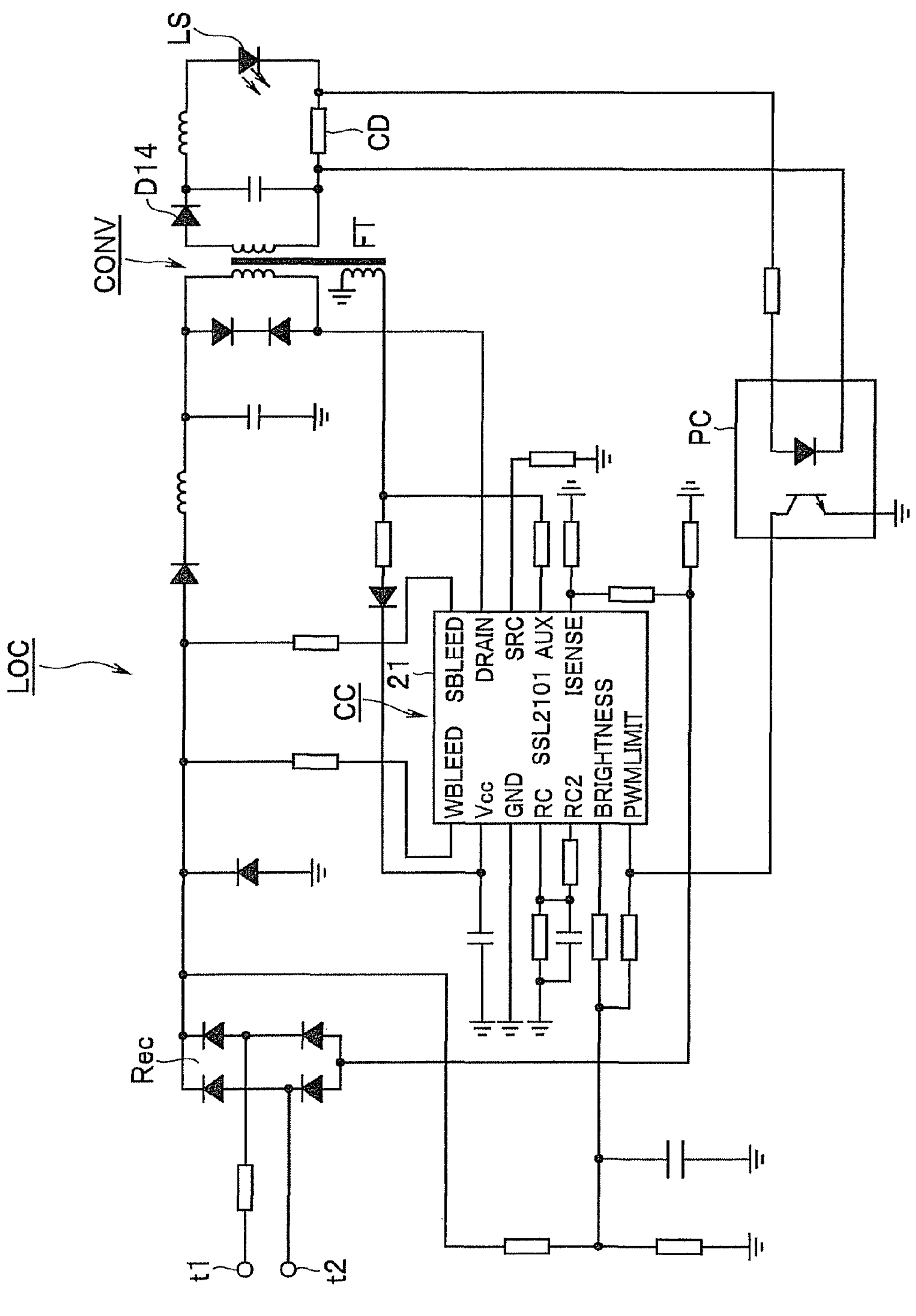
FIG. 14 is a diagram of an illumination device according to a fifth embodiment of the present invention.

A fifth embodiment of the present invention will be described. As illustrated in FIG. 14, the fifth embodiment is different from the second to fourth embodiments in that a damping resistor Rd includes a voltage-dependent nonlinear resistor. In the Figure, the same components as those in FIG. 13 are provided with the same symbols, and a description of those components will be omitted.

In the present embodiment, the voltage-dependent nonlinear resistor is a surge absorption element having a breakdown voltage set so as to absorb a voltage higher than a peak value of a power source voltage from a transient oscillation voltage generated in a sharp rise in each half cycle of a voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An illumination device comprising:

a self-hold element connected in series to an AC power source that generates power for lighting an illumination load, together with the illumination load, the self-hold element being configured to control supply of the power provided by the AC power source to the illumination load by the self-hold element being turned on/off;

a noise prevention circuit connected in parallel to the self-hold element; and an input terminal for inputting an on/off output of the self-hold element;

a rectifier circuit including an AC input end connected to the input terminal;

an LED lighting circuit including an input end connected to DC output ends of the rectifier circuit; and a damping resistor configured to be connected to the DC output ends of the rectifier circuit only for a predetermined period at the start of application of each half wave of a power source voltage to the input terminal.

2. The illumination device according to claim 1, further comprising:

a switch connected in series between a positive output end and a negative output end of the rectifier circuit, the positive output end and the negative output end being included in the DC output ends of the rectifier circuit, together with the damping resistor; and a control unit configured to detect a voltage of the DC output ends of the rectifier circuit to control on/off of the switch, thereby connecting the damping resistor to the DC output ends of the rectifier circuit.

3. The illumination device according to claim 1, further comprising a phase-control dimmer including an input end connected to an AC power source, and an output end connected to the input terminal.

4. A bulb-shaped LED lamp comprising the illumination device according to claim 1.

5. The illumination device according to claim 2, wherein the control unit turns on the switch using an output of a monostable circuit, the monostable circuit being configured to generate an output only for a predetermined short period of time at the start of application of each half cycle of the power source voltage.

6. The illumination device according to claim 2, wherein the damping resistor includes a voltage-dependent nonlinear resistor.

7. The illumination device according to claim 2, wherein the control unit turns off the switch within 1 ms after application of each half cycle of the power source voltage.

8. The illumination device according to claim 2, further comprising a phase-control dimmer including an input end connected to an AC power source, and an output end connected to the input terminal.

9. A bulb-shaped LED lamp comprising the illumination device according to claim 2.

10. The illumination device according to claim 5, further comprising a phase-control dimmer including an input end connected to an AC power source, and an output end connected to the input terminal.

11. A bulb-shaped LED lamp comprising the illumination device according to claim 5.

12. The illumination device according to claim 6, further comprising a phase-control dimmer including an input end connected to an AC power source, and an output end connected to the input terminal.

13. A bulb-shaped LED lamp comprising the illumination device according to claim 6.

14. The illumination device according to claim 7, further comprising a phase-control dimmer including an input end connected to an AC power source, and an output end connected to the input terminal.

15. A bulb-shaped LED lamp comprising the illumination device according to claim 7.

* * * * *